United States Patent
Roy et al.

(10) Patent No.: US 8,994,138 B2
(45) Date of Patent: Mar. 31, 2015

(54) HARDENED PHOTODIODE IMAGE SENSOR

(71) Applicants: STMicroelectronics S.A., Montrouge (FR); STMicroelectronics (Crolles2) SAS, Crolles (FR)

(72) Inventors: François Roy, Seyssins (FR); Sebastien Place, Grenoble (FR)

(73) Assignees: STMicroelectronics S.A., Montrouge (FR); STMicroelectronics (Crolles 2) SAS, Crolles (FR)

( * ) Notice: Subject to any disclaimer, the term of this patent is extended or adjusted under 35 U.S.C. 154(b) by 136 days.

(21) Appl. No.: 13/710,260

(22) Filed: Dec. 10, 2012

(65) Prior Publication Data

US 2013/0155283 A1    Jun. 20, 2013

(30) Foreign Application Priority Data

Dec. 16, 2011 (FR) ...................................... 11 61775

(51) Int. Cl.
*H01L 27/146* (2006.01)
*H01L 31/18* (2006.01)
*H04N 5/76* (2006.01)

(52) U.S. Cl.
CPC .......... *H01L 27/14643* (2013.01); *H01L 31/18* (2013.01); *H04N 5/76* (2013.01)
USPC .......................... 257/443; 438/73; 348/231.99

(58) Field of Classification Search
CPC ......... H01L 31/18; H01L 27/146; H04N 5/76
USPC .......................... 257/443; 348/231.99; 438/73
See application file for complete search history.

(56) References Cited

U.S. PATENT DOCUMENTS

| | | | |
|---|---|---|---|
| 6,211,509 B1 | 4/2001 | Inoue et al. | |
| 8,263,856 B2 * | 9/2012 | Cornfeld et al. | 136/256 |
| 2002/0050593 A1 | 5/2002 | Fukunaga et al. | |
| 2008/0001179 A1 * | 1/2008 | Roy | 257/228 |
| 2009/0242949 A1 * | 10/2009 | Adkisson et al. | 257/292 |
| 2010/0019295 A1 * | 1/2010 | Henderson et al. | 257/292 |
| 2011/0008925 A1 * | 1/2011 | Adkisson et al. | 438/59 |
| 2011/0096208 A1 * | 4/2011 | Roy et al. | 348/243 |

(Continued)

FOREIGN PATENT DOCUMENTS

| | | |
|---|---|---|
| EP | 1 551 062 A2 | 7/2005 |
| WO | WO 01/67518 A1 | 9/2001 |

OTHER PUBLICATIONS

French Search Report dated Oct. 1, 2012 from corresponding French Application No. 11/61775.

*Primary Examiner* — Caleb Henry
(74) *Attorney, Agent, or Firm* — Seed IP Law Group PLLC

(57) ABSTRACT

An image sensor including a pixel array, each pixel including, in a substrate of a doped semiconductor material of a first conductivity type, a first doped region of a second conductivity type at the surface of the substrate; an insulating trench surrounding the first region; a second doped region of the first conductivity type, more heavily doped than the substrate, at the surface of the substrate and surrounding the trench; a third doped region of the second conductivity type, forming with the substrate a photodiode junction, extending in depth into the substrate under the first and second regions and being connected to the first region; and a fourth region, more lightly doped than the second and third regions, interposed between the second and third regions and in contact with the first region and/or with the third region.

11 Claims, 2 Drawing Sheets

(56) References Cited

U.S. PATENT DOCUMENTS

| | | | | |
|---|---|---|---|---|
| 2011/0241149 | A1* | 10/2011 | Mazzillo et al. | 257/438 |
| 2011/0272561 | A1* | 11/2011 | Sanfilippo et al. | 250/214.1 |
| 2012/0080765 | A1* | 4/2012 | Ku et al. | 257/432 |
| 2012/0133011 | A1* | 5/2012 | Ueno et al. | 257/432 |
| 2012/0153127 | A1* | 6/2012 | Hirigoyen et al. | 250/208.1 |
| 2012/0153422 | A1* | 6/2012 | Coulon et al. | 257/435 |
| 2012/0188431 | A1* | 7/2012 | Takimoto | 348/311 |
| 2012/0217558 | A1* | 8/2012 | Togashi | 257/292 |
| 2012/0248515 | A1* | 10/2012 | Hsiao et al. | 257/292 |
| 2012/0270364 | A1* | 10/2012 | Katayama | 438/98 |
| 2012/0313204 | A1* | 12/2012 | Haddad et al. | 257/432 |
| 2012/0313205 | A1* | 12/2012 | Haddad et al. | 257/432 |
| 2012/0313211 | A1* | 12/2012 | Nakazawa et al. | 257/448 |
| 2013/0056808 | A1* | 3/2013 | Tai et al. | 257/292 |
| 2013/0155283 | A1* | 6/2013 | Roy et al. | 348/231.99 |
| 2014/0312386 | A1* | 10/2014 | Huang et al. | 257/184 |

* cited by examiner

HARDENED PHOTODIODE IMAGE SENSOR

CROSS REFERENCE TO RELATED APPLICATIONS

This application claims the priority benefit of French patent application number 1161775, filed on Dec. 16, 2011, which is hereby incorporated by reference to the maximum extent allowable by law.

BACKGROUND

1. Technical Field

The present disclosure generally relates to integrated photodetectors, for example, photodetectors of an image sensor. More specifically, the present disclosure relates to the protection—or hardening—of such photodetectors against ionizing radiations.

2. Discussion of the Related Art

Image sensors may comprise photosensitive sites and transistors formed in a semiconductor substrate, for example, silicon. More specifically, such image sensors comprise a pixel array, each pixel comprising at least one photodiode comprising a P-N junction formed in the substrate. Photons reaching the pixel may cause the forming of electron/hole pairs in the substrate. The electron/hole pairs may form in the photodiode depletion area. The electric field present in the depletion area then directs electrons towards the N-type doped region and holes towards the P-type doped region. The electron/hole pairs may form in the substrate in a P-type or N-type doped region. When an electron/hole pair forms at a shorter distance from the depletion area than the minority carrier diffusion distance, the minority carrier (electron or hole) may diffuse all the way to the depletion area. The electric field present in the depletion area then directs the minority carrier towards the P-type or N-type region where it is a majority carrier. The collection of electrons and holes by the photodiode appears as a measurable variation of the voltage across the photodiode.

The quantum efficiency of the pixel corresponds to the ratio of the number of electrons that can be collected by the photodiode to the number of photons reaching the pixel. It is desirable to have the highest possible quantum efficiency.

The dark current of the pixel corresponds to the signal provided by the photodiode in the absence of any lighting. It results from the forming of electron/hole pairs in the pixel in the absence of any lighting, which electrons and holes may be collected by the photodiode. Thermal agitation generally causes the forming of electron/hole pairs in the substrate. The presence of defects at the interface between the semiconductor substrate and a portion of an insulating material increases the electron/hole pair forming speed in the substrate at the level of this interface, especially in a depletion area. Such is especially the case at the interface between the semiconductor substrate and the insulating layer covering the substrate or at the interface between the semiconductor substrate and insulating trenches formed in the substrate to insulate doped regions.

Image sensors may be submitted to an ionizing radiation, for example, a gamma radiation, in particular when they are used for space applications.

The dark current of the pixel may vary under the effect of the ionizing radiation. Two phenomena may cause a variation of the dark current. First, the state of the interfaces between the insulating portions and the semiconductor substrate may damage under the action of the ionizing radiation, which increases the electron/hole forming speed at these interfaces. Second, the ionizing radiation may cause the forming of positive charges in the insulating portions of the pixel. By electrostatic effect, such positive charges push back the holes present at the interface of the P-type doped regions. This causes a local increase of the dimensions of the depletion area in the P-type doped region close to the interface with the insulating portion, and thus an increase of the number of electron/hole pairs formed in the absence of any lighting at the interface between the substrate and the insulating portion in the depletion area.

The pixel hardening especially aims at decreasing the variation of the dark current of the pixel in the presence of an ionizing radiation.

The pixel of an image sensor may comprise the three following electronic components: the photodiode, a charge reading transistor, a reset transistor, and a selection transistor. The photodiode is in charge of collecting and storing the charges photogenerated in the pixel (for example, electrons). The photodiode is connected to the charge reading transistor (follower-assembled transistor) and to the reset transistor. The line selection transistor allows a sequential line-by-line reading.

For many image sensors, the substrate is doped with a first conductivity type and the photodiode of the pixel is obtained by forming, at the substrate surface, a doped region of the second conductivity type. The doped region is laterally insulated by an insulating trench formed in the substrate. The quantum efficiency of the photodiode may be increased by increasing the surface of the P-N junction, that is, by a lateral extension of the doped region. This however increases the insulating trench dimensions. The dark current thus increases, as well as the sensitivity of the dark current to ionizing radiations.

There thus is a need for a photodiode simultaneously having a high quantum efficiency and a decreased sensitivity of the dark current to ionizing radiations.

SUMMARY

Embodiments aim at, at least partly, addressing one or several issues in the prior art.

Thus, an embodiment provides an image sensor comprising a pixel array, each pixel comprising, in a substrate of a doped semiconductor material of a first conductivity type, a first doped region of a second conductivity type at the surface of the substrate; a trench of an insulating material surrounding the first region; a second doped region of the first conductivity type, more heavily doped than the substrate, at the surface of the substrate and surrounding the trench; a third doped region of the second conductivity type, forming with the substrate a photodiode junction, extending in depth into the substrate under the first and second regions and being in contact with the first region or connected to the first region by one or several additional regions of the second conductivity type; and a fourth doped region of the first or of the second conductivity type, more lightly doped than the second and third regions, interposed between the second and third regions and in contact with the first region and/or with the third region.

According to an embodiment, the ratio of the external lateral perimeter of the trench to the external lateral perimeter of the third region is smaller than or equal to 5.

According to an embodiment, the dopant concentration of the fourth region is smaller than or equal to $10^{16}$ atoms/cm$^3$.

According to an embodiment, the dopant concentration of the second region is smaller than or equal to $10^{17}$ atoms/cm$^3$.

According to an embodiment, the dopant concentration of the third region is smaller than or equal to $10^{16}$ atoms/cm$^3$.

According to an embodiment, the dopant concentration of the substrate is smaller than or equal to $10^{16}$ atoms/cm$^3$.

According to an embodiment, the dopant concentration of the first region is greater than the dopant concentration of the third region.

According to an embodiment, the image sensor comprises a fifth region of the second conductivity type interposed between the first region and the third region, the dopant concentration of the fifth region being smaller than the dopant concentration of the first region and greater than or equal to the dopant concentration of the third region.

Another embodiment provides a camera comprising an image sensor, such as defined hereabove, capable of providing images and a device for storing said images.

An embodiment provides a method for manufacturing an image sensor comprising a pixel array, the method comprising the steps, for each pixel in a substrate of a doped semiconductor material of a first conductivity type, of:

forming a first doped region of a second conductivity type at the surface of the substrate;

forming a trench of an insulating material surrounding the first region;

forming a second doped region of the first conductivity type, more heavily doped than the substrate, at the surface of the substrate and surrounding the trench;

forming a third doped region of the second conductivity type, forming with the substrate a photodiode junction, extending in depth into the substrate under the first and second regions and being in contact with the first region or connected to the first region by one or several regions of the second conductivity type; and forming a fourth doped region of the first or second conductivity type, more lightly doped than the second and third regions, interposed between the second and third regions and in contact with the first region and/or with the third region.

According to an embodiment, the fourth region is doped with the second conductivity type, the third and fourth regions being formed in a single step of implantation of dopants of the second conductivity type.

According to an embodiment, the method further comprises the step of forming a fifth region of the second conductivity type interposed between the first region and the third region, the dopant concentration of the fifth region being smaller than the dopant concentration of the first region and greater than or equal to the dopant concentration of the third region, the fifth region being obtained by several implantations of dopants of the second conductivity type having different implantation energies.

The foregoing and other features and advantages will be discussed in detail in the following non-limiting description of specific embodiments in connection with the accompanying drawings.

DETAILED DESCRIPTION

Figure 1:
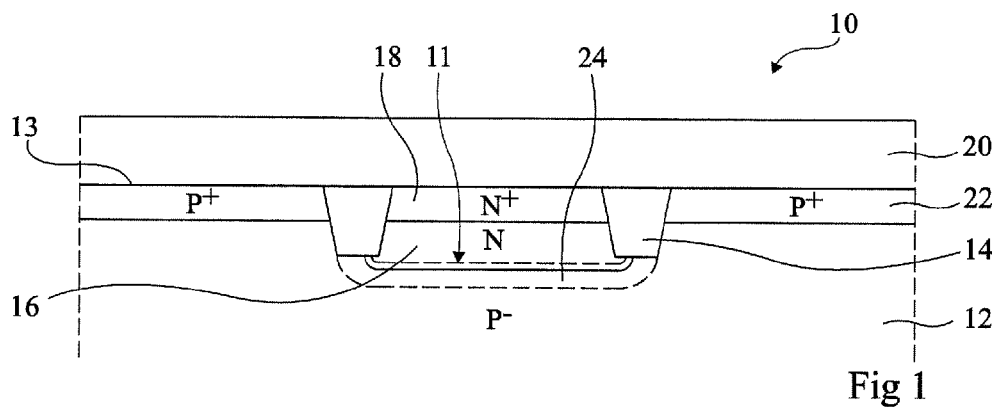
FIG. 1 is a simplified cross-section view of an example of a photodiode formed in a substrate.

For clarity, the same elements have been designated with the same reference numerals in the different drawings and, further, as usual in the representation of integrated circuits, the various drawings are not to scale. Further, only those elements which are necessary to the understanding of the embodiments have been shown.

Figure 2:
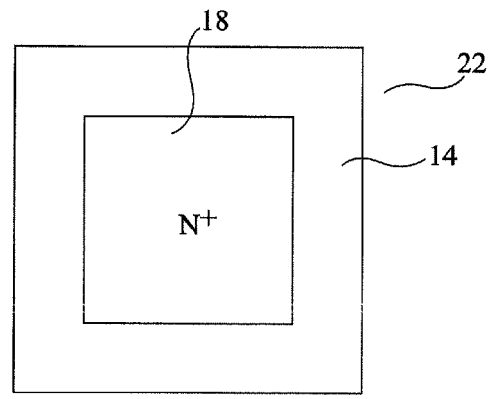
FIG. 2 is a simplified top view of the substrate of the photodiode of FIG. 1.

FIG. 1 is a cross-section view illustrating a pixel 10 of an image sensor comprising a photodiode 11 formed in a substrate 12 of a semiconductor material, for example, silicon. The image sensor may comprise a pixel array. The substrate may be a lightly-doped P-type silicon layer 12 (P$^-$), for example, an epitaxial layer formed on a silicon wafer. Substrate 12 comprises an upper surface 13. FIG. 2 is a simplified top view of surface 13.

Photodiode 11 is provided at the surface of substrate 12 and is delimited by an insulating trench 14. Insulating trench 14 is formed of an insulating material, for example, silicon dioxide, and may be of STI (Shallow Trench Insulation) type. Insulating trench 14 may be arranged in top view as a square or a rectangle. Photodiode 11 comprises an N-type doped region 16 formed in substrate 12 in the opening delimited by insulating trench 14. A heavily-doped N-type region 18 (N$^+$) is provided at the surface of region 16 to ease the forming of an ohmic contact. Surface 13 of substrate 12 is covered with a stack 20 of insulating layers for example, made of silicon dioxide. Conductive tracks and vias, not shown, are formed in stack 20 of insulating layers and especially connect the terminals of photodiode 11. Further, the other electronic components of the pixel have not been shown. A heavily-doped P-type region 22 (P$^+$) is provided at the surface of substrate 12 around insulating trench 14. A depletion area 24 forms at the junction between region 16 and substrate 12. The limits of depletion area 24 are schematically shows by dashed lines in FIG. 1.

When light rays reach pixel 10, electron/hole pairs form in substrate 12. The charges photogenerated in depletion area 24 are collected and stored in the P-N junction with a maximum efficiency. The charges photogenerated outside of depletion area 24 are collected due the mechanism of diffusion of minority carriers in the P-type doped regions. The charge collection efficiency is thus decreased and the quantum efficiency of the pixel is decreased. Statistically, the electrons photogenerated at a distance from depletion area 24 shorter than the minority carrier diffusion distance are collected by photodiode 11. The quantum efficiency of pixel 10 shown in FIG. 1 especially depends on the surface of the P-N junction between region 16 and substrate 12.

The dark current of pixel 10 is due to the charges collected by photodiode 11 in the absence of any lighting. Indeed, the defects electrically active at the silicon-oxide interfaces result in the creation of electron/hole pairs. FIG. 1 shows two types of interfaces, the interface between insulating layer 20 and silicon substrate 12 and the interface between insulating trench 14 and silicon substrate 12. An efficient solution to limit the dark current at the insulation oxide/silicon interface is to create a region having a high hole or electron concentration at this interface. This region is formed by enhancing the P-type doping (region 22) or the N-type doping (region 18). However, depletion area 24 of a P-N junction at the oxide/silicon interface is, by definition, an area without free carriers and thus is an area with a very high dark current generation rate. The electron/hole pairs which form in the semiconductor material of depletion area 24 in contact with insulating trench 14 may be collected by photodiode 11.

It is possible to form several photodiodes 11 such as shown in FIG. 1 within a same pixel to increase the quantum efficiency. It is further possible to increase the dimensions of each photodiode 11.

Figure 3:
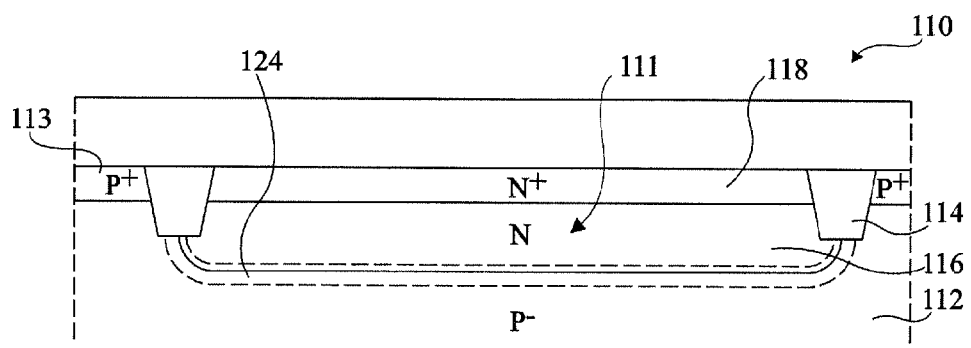
FIGS. 3 and 4 are simplified cross-section views of other examples of photodiodes.

FIG. 3 shows an example of a pixel 110 comprising a photodiode 111 of improved quantum efficiency. Each element of FIG. 3 identical or similar to an element of FIG. 1 by its structure or its function is designated with the reference numeral used in FIG. 1 preceded by "1". Photodiode 111 illustrated in FIG. 3 differs from photodiode 11 illustrated in FIG. 1 by the transverse dimensions of insulating trench 114, of N-type doped region 116, and of heavily-doped N-type region 118.

A disadvantage of photodiode 111 is that the surface of insulating trench 114 in contact with the semiconductor material and, in particular, in contact with depletion area 124 of photodiode 111, is increased. This causes, in the presence of an ionizing radiation, an increase of the dark current. The same disadvantage appears when the number of photodiodes 11 per pixel is increased.

To increase the quantum efficiency of the photodiode without increasing the surface area of the insulating trenches, a possibility is not to modify the dimensions of insulating trench 14 of photodiode 11 shown in FIG. 1 and of only increasing the lateral dimensions of N-type doped region 16.

Figure 4:
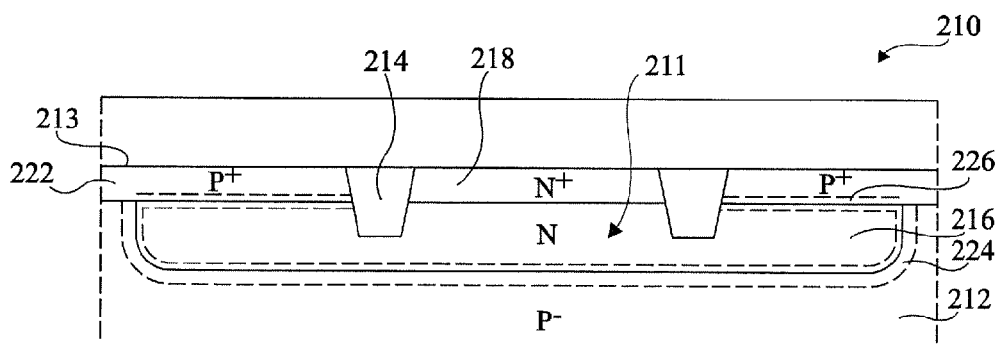

FIG. 4 is a cross-section view illustrating a photodiode 210 having an improved quantum efficiency without increasing the dark current. Each element of FIG. 4, identical or similar to an element of FIG. 1 by its structure or its function, is designated with the reference numeral used in FIG. 1 preceded by "2".

The dimensions of insulating trenches 214 and of heavily-doped N-type regions 218 are identical to those of photodiode 11. Region 216 extends laterally beyond insulating trench 214. A depletion area 226 thus forms at the P-N junction between heavily-doped P-type region 222 and N-type region 216 around insulating trench 214. The limit of depletion area 226 is schematically shown in FIG. 4 by a dashed line.

The method for manufacturing region 216 generally corresponds to a method for forming a so-called "well" structure comprising successive implantations at different implantation energies and which results in the forming of a region having a substantially constant dopant concentration over most of the depth of region 216.

Generally, width W of a depletion area is provided by the following relation (1):

$$W = \sqrt{2 \frac{\varepsilon_S \varepsilon_0}{q} \left( \frac{1}{N_A} + \frac{1}{N_D} \right) (V_0 - V)} \quad (1)$$

where $\varepsilon_0$ is the dielectric permittivity of vacuum, $\varepsilon_S$ is the relative permittivity of the semiconductor material, q is the charge of an electron, $N_D$ is the N-type dopant concentration (for example, phosphorus) of the N-type doped region forming the P-N junction, $N_A$ is the P-type dopant concentration (for example, boron) of the P-type doped region forming the P-N junction, $V_0$ is the voltage induced by the forming of the depletion area of the photodiode when the photodiode is not biased, and V is the photodiode bias voltage. The depletion area extends more in the more lightly doped region forming the P-N junction.

Thereby, depletion area 226 resulting from the P-N junction between P-type region 222 and N-type region 216 is narrow, for example, smaller than 100 nm, since the dopant concentrations are high in these regions, for example, on the order of $10^{18}$ atoms/cm$^3$ for P-type region 222 and on the order of $10^{18}$ atoms/cm$^3$ for N-type region 216.

Junction capacitance C associated with a depletion area is provided by the following relation (2):

$$C = \frac{\varepsilon_S A}{W} \quad (2)$$

where A is the surface area of the P-N junction, that is, the contact surface area between the P-type and N-type regions. Junction capacitance C is thus directly dependent on surface area A and inversely dependent on width W of depletion area. To maximize the gain of conversion of the charge into a voltage, the capacitance of the P-N junction must be as low as possible.

Thereby, for photodiode 211, a compromise must be found between the increase of the quantum efficiency of photodiode 211 and the resulting increase of the junction capacitance of photodiode 211.

Figure 5:
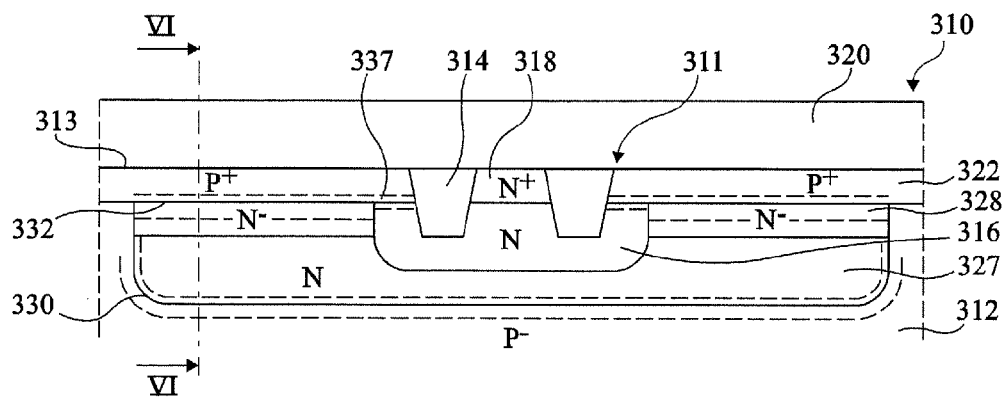
FIG. 5 is an embodiment of a hardened photodiode.

FIG. 5 shows an embodiment of a photodiode 311 of a pixel 310 simultaneously having an improved quantum efficiency, a small variation of the dark current in the presence of an ionizing radiation, and a junction capacitance having a reduced and controlled increase. Each element of FIG. 5, identical or similar to an element of FIG. 1 by its structure or its function, is designated with the reference numeral used in FIG. 1 preceded by "3".

As compared with photodiode 211 illustrated in FIG. 4, region 316 of photodiode 311 has decreased lateral dimensions and does not extend much beyond insulation trench 314. Photodiode 311 comprises, under region 316 and in contact therewith, an N-type region 327 which forms a P-N junction with substrate 312. N-type region 327 may have the same dopant concentration as N-type region 316 or be more lightly doped than region 316. A lightly-doped N-type region 328 (N⁻) is interposed between P-type region 322 and N-type region 327. Region 328 forms a P-N junction with region 322. A depletion area 330 forms at the junction between region 327 and substrate 312 and a depletion area 332 forms at the junction between regions 324 and 313. The limits of depletion areas 330 and 332 are shown by dashed lines in FIG. 5.

As an example, the dopant concentrations have the following orders of magnitude:
P-type doped region 322: $10^{18}$ atoms/cm$^3$;
N-type doped region 327: $10^{16}$ atoms/cm$^3$;
N-type doped region 316: $10^{18}$ atoms/cm$^3$;
lightly-doped N-type region 328: $10^{15}$ atoms/cm$^3$;
heavily-doped N-type region 318: $10^{19}$ atoms/cm$^3$; and
lightly-doped P-type region 312: $10^{15}$ atoms/cm$^3$.

As an example, the depths of the doped regions with respect to surface 313 of substrate 312 have the following orders of magnitude:
P-type doped region 322: 0.1 µm;
insulating trench 314: 0.3 µm;
N-type doped region 327: from 1.5 to 2 µm;
N-type doped region 316: from 0.5 to 1.5 µm;
lightly-doped N-type region 328: from 0.5 to 1 µm;
heavily-doped N-type doped region 318: 0.3 µm; and
lightly-doped P-type region 312: greater than 3 µm.

Pixel 310 may comprise several photodiodes 311. As a variation, pixel 310 may comprise a single region 327 and several assemblies, each comprising insulating trench 314 and N-type doped regions 316, 318. Regions 316 of these assemblies then are in contact with region 327 at different locations.

An example of a method for manufacturing photodiode 311 of pixel 310 comprises the steps of:
  forming substrate 312 on a silicon wafer by epitaxy;
  forming insulating trench 314;
  forming N-type doped regions 327 and 328, for example, in a single implantation step with an implantation energy ranging from 400 keV to 2 MeV and a phosphorus dose ranging from $10^{11}$ to $10^{12}$ atoms/cm$^2$;
  forming N-type doped region 316, by several successive implantations;
  forming heavily-doped N-type region 318;
  forming heavily-doped P-type region 322 which delimits lightly-doped N-type region 328; and
  forming stack 320 of insulating layers and the conductive tracks and vias.

The order of some of the steps of the previously-described manufacturing method may be modified.

Figure 6:
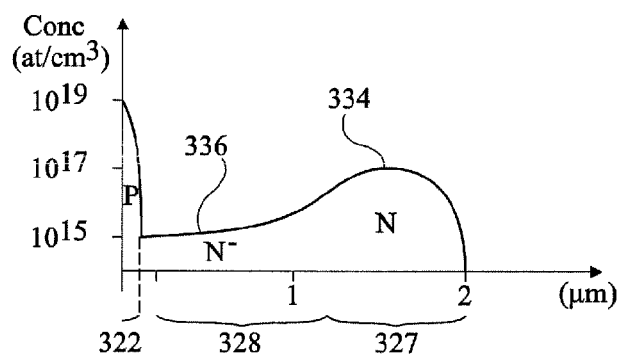
FIG. 6 shows the variation of the dopant concentration versus the depth of the hardened photodiode of FIG. 5 along line VI-VI.

FIG. 6 shows the variation of the dopant concentration (Conc) according to the depth measured from surface 313 of substrate 312 at the level of line VI-VI of FIG. 5 when the previously-described manufacturing method is implemented.

Lightly-doped N-type region 328 may be formed simultaneously to more heavily-doped N-type region 327. Indeed, the step of implantation of N-type dopants is carried out by multiple dose and energy implantations resulting in the forming of an area 334, where the N-type dopant concentration is maximum, preceded by an area 336 where the N-type dopant concentration is smaller than the maximum concentration and which extends all the way to surface 313. Region 327 then corresponds to the N-type dopant concentration peak. The implantation of P-type dopants results in the forming of region 322 and delimits lightly-doped N-type region 328. The implantation of P-type dopants may be performed before or after the step of N-type dopant implantation for the forming of regions 327 and 328. The method has the advantage of having a small number of additional steps with respect to the method for manufacturing photodiode 11 shown in FIG. 1.

Given that the dopant concentration of region 328 of photodiode 311 is smaller, for example, by a factor one thousand, than the dopant concentration of region 216 of photodiode 211, the thickness of depletion area 332 is greater, for example, by a factor thirty, than the thickness of depletion area 226 of photodiode 211 shown in FIG. 4. As an example, the total thickness of depletion area 334 may be greater than 1 μm. Thereby, the capacitance of the P-N junction between regions 322 and 328 is small and only slightly increases the total capacitance of photodiode 311.

Further, the charge collection efficiency of the photodiode is mainly defined by depletion area 330 which forms at the junction between region 327 and substrate 312. Since regions 316 and 318 have a small part in the collection efficiency of photodiode 311, the dimensions of insulating trench 314 and of region 318 may be decreased to a minimum while taking into account the constraints due to the methods used to manufacture photodiode 311. This enables to decrease the value of the dark current due to insulating trench 314 and also the sensitivity to the dark current to ionizing radiations. As an example, the ratio between the external lateral perimeter of N-type doped region 327 and the external lateral perimeter of trench 314 is greater than or equal to twenty, for example, greater than or equal to one hundred.

The lateral dimensions of region 316 may be the smallest possible dimensions allowed by the methods used to manufacture photodiode 311. However, the constraints due to the manufacturing technology of photodiode 311 may impose for region 316 to laterally extend beyond insulating trench 314 as shown in FIG. 5. A P-N junction is then present between heavily-doped P-type region 322 and N-type region 316. Depletion area 337 associated with this P-N junction is much narrower than depletion area 330. Thereby, the resulting increase of the dark current is reduced. Further, the surface area of the junction between heavily-doped P-type region 322 and N-type region 316 being decreased, its contribution to the total capacitance of photodiode 311 is decreased.

Figure 7:
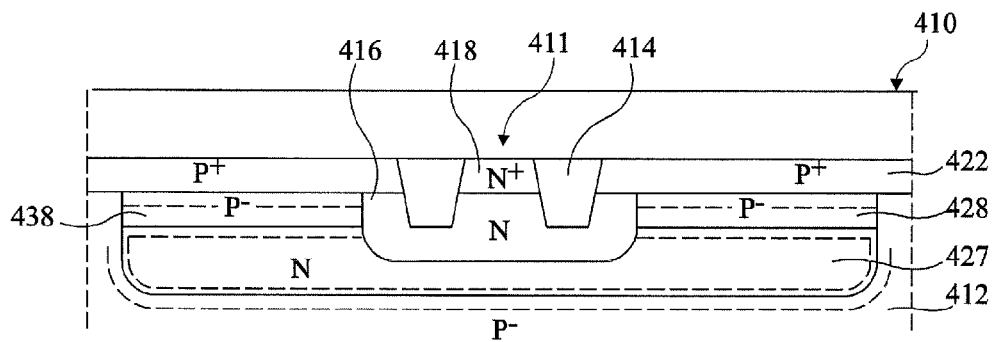
FIG. 7 shows another embodiment of a hardened photodiode.

FIG. 7 shows another embodiment of a photodiode 411 of a pixel 410 simultaneously having an improved quantum efficiency, a small variation of the dark current in the presence of an ionizing radiation, and a decreased junction capacitance. Each element of FIG. 5, identical or similar by its structure or its function to an element of FIG. 1, is designated with the reference numeral used in FIG. 1 preceded by "4".

Photodiode 411 has a structure similar to photodiode 311, with the difference that lightly-doped N-type diode 328 is replaced with a lightly-doped P-type region 428 (P$^-$).

Region 428 may be formed by a specific P-type dopant implantation step. As a variation, region 428 may correspond to a portion of lightly-doped P-type substrate 412 which is delimited at the forming of regions 427 and 422. As an example, the P-type dopant concentration of region 428 is approximately $10^{15}$ atoms/cm$^3$. Depletion area 438 associated with the P-N junction between P-type doped region 428 and N-type doped region 427 has a significant thickness since the P-type dopant concentration of region 428 is low. This junction thus has a decreased capacitance. Further, the dark current due to this junction is decreased.

Specific embodiments of have been described. Various alterations, modifications, and improvements will occur to those skilled in the art. In particular, region 316 is mainly used to provide an electric continuity between region 327 and region 318 and may be different from what has been previously described in relation with FIGS. 5 and 7 as long as it carries out this function. As an example, region 316 may stop laterally at the level of the insulating trench. Further, the conductivity types of the substrate and of the doped regions formed in the substrate may be inverted with respect to what has been previously described.

It should further be noted that those skilled in the art may combine various elements of these various embodiments and variations without showing any inventive step. In particular, lightly-doped N-type region 328 of photodiode 311 may be replaced with a stack of a lightly-doped P-type region in contact with heavily-doped P-type region 322 and of a lightly-doped N-type region in contact with N-type doped region 327, these two lightly-doped regions forming a P-N junction.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An image sensor, comprising:
  a substrate of a doped semiconductor material of a first conductivity type; and
  a pixel array in the substrate, each pixel of the pixel array including:
    a first doped region of a second conductivity type at a surface of the substrate;
    a trench of an insulating material;

a second doped region of the first conductivity type at the surface of the substrate, the second doped region more heavily doped than the substrate;

a third doped region of the second conductivity type, extending beneath the first and second doped regions and electrically coupled to the first doped region, a photodiode junction formed by the third doped region and a portion of the substrate; and a fourth doped region between the second and third doped regions and electrically coupled to the second doped region or the third doped region, the fourth doped region more lightly doped than the second and third doped regions, the trench being around the first doped region, the second doped region being around the trench.

2. The image sensor of claim 1, wherein a ratio of an external lateral perimeter of the trench to an external lateral perimeter of the third region is greater than or equal to about 20.

3. The image sensor of claim 1, wherein the dopant concentration of the fourth region is smaller than or equal to $10^{16}$ atoms/cm$^3$.

4. The image sensor of claim 1, wherein the dopant concentration of the second region is greater than or equal to $10^{17}$ atoms/cm$^3$.

5. The image sensor of claim 1, wherein the dopant concentration of the third region is greater than or equal to $10^{16}$ atoms/cm$^3$.

6. The image sensor of claim 1, wherein the dopant concentration of the substrate is smaller than or equal to $10^{16}$ atoms/cm$^3$.

7. The image sensor of claim 1, wherein the dopant concentration of the first region is greater than the dopant concentration of the third region.

8. The image sensor of claim 1, comprising:

a fifth doped region of the second conductivity type between the first doped region and the third doped region, the dopant concentration of the fifth doped region being smaller than the dopant concentration of the first doped region and greater than or equal to the dopant concentration of the third doped region.

9. A method for manufacturing an image sensor, comprising:

forming a pixel array in a substrate of a doped semiconductor material of a first conductivity type, the forming a pixel array including:

forming a first doped region of a second conductivity type at a surface of the substrate;

forming a trench of an insulating material;

forming a second doped region of the first conductivity type at the surface of the substrate, the second doped region more heavily doped than the substrate;

forming a third doped region of the second conductivity type, extending into the substrate under the first and second doped regions and electrically coupled to the first doped region, the third doped region forming with a portion of the substrate a photodiode junction; and forming a fourth doped region between the second and third doped regions and electrically coupled to the second doped region or the third doped region, the fourth doped region more lightly doped than the second and third doped regions, the trench being around the first doped region, the second doped region being around the trench.

10. The method of claim 9, wherein the fourth region is doped with the second conductivity type, and the third and fourth doped regions are formed in a single step of implantation of dopants of the second conductivity type.

11. The method of claim 9, further comprising:

forming a fifth doped region of the second conductivity type between the first doped region and the third doped region, the dopant concentration of the fifth doped region being smaller than the dopant concentration of the first doped region and greater than or equal to the dopant concentration of the third doped region, the fifth doped region being formed by several implantations of dopants of the second conductivity type having different implantation energies.

\* \* \* \* \*